United States Patent [19]
Kanazawa et al.

[11] Patent Number: 5,767,579
[45] Date of Patent: Jun. 16, 1998

[54] SEMICONDUCTOR DEVICE HAVING AN ELECTRICAL CONNECTION BETWEEN A CONTROL ELECTRODE AND A RESISTIVE LAYER

[75] Inventors: Kenichi Kanazawa; Kiyoshi Arai, both of Tokyo, Japan

[73] Assignee: Mitsubishi Denki Kabushiki Kaisha, Tokyo, Japan

[21] Appl. No.: 691,318

[22] Filed: Aug. 2, 1996

[30] Foreign Application Priority Data

Dec. 21, 1995 [JP] Japan .................... 7-333101

[51] Int. Cl.$^6$ .............. H01L 25/07; H01L 23/16; H01L 39/02; H01L 23/48
[52] U.S. Cl. ............... 257/717; 257/723; 257/724; 257/720; 257/712; 257/698; 257/693; 257/691
[58] Field of Search ................... 257/698, 691, 257/693, 706, 707, 712, 717, 720, 723, 724

[56] References Cited

U.S. PATENT DOCUMENTS

| | | | |
|---|---|---|---|
| 4,941,067 | 7/1990 | Craft | 257/720 |
| 5,005,178 | 4/1991 | Kluitmans et al. | 257/712 |
| 5,075,759 | 12/1991 | Moline | 257/712 |
| 5,291,065 | 3/1994 | Arai et al. | 257/724 |
| 5,371,405 | 12/1994 | Kagawa | 257/725 |
| 5,488,256 | 1/1996 | Tsunoda | 257/691 |
| 5,504,372 | 4/1996 | Braden et al. | 257/724 |
| 5,519,253 | 5/1996 | Lake et al. | 257/692 |
| 5,536,972 | 7/1996 | Kato | 257/707 |
| 5,537,074 | 7/1996 | Iversen et al. | 257/712 |
| 5,539,254 | 7/1996 | Eytcheson et al. | 257/691 |
| 5,616,955 | 4/1997 | Yamada et al. | 257/692 |

FOREIGN PATENT DOCUMENTS

| | | |
|---|---|---|
| 5-275608 | 10/1993 | Japan . |
| 5-347377 | 12/1993 | Japan . |
| 6-165570 | 6/1994 | Japan . |

*Primary Examiner*—Wael Fahmy
*Assistant Examiner*—Alexander Oscar Williams
*Attorney, Agent, or Firm*—Oblon, Spivak, McClelland, Maier & Neustadt, P.C.

[57] ABSTRACT

A terminal base (N1) is electrically connected to a conductive foil pattern (201), and a terminal base (N2) is electrically connected to switching elements (T1, T2, T3). The control electrodes of the switching elements (T1, T2, T3) are electrically connected to resistors (R10, R20, R30) with wire lines (WL). Thus, by using the resistors on which the wire lines can be bonded direct, a size-reduced semiconductor device is provided.

7 Claims, 9 Drawing Sheets

1

SEMICONDUCTOR DEVICE HAVING AN ELECTRICAL CONNECTION BETWEEN A CONTROL ELECTRODE AND A RESISTIVE LAYER

BACKGROUND OF THE INVENTION

1. Field of the Invention

The present invention relates to a modular semiconductor device, and more particularly to a semiconductor device which internally has a switching element with a gate resistor attached thereto.

2. Description of the Background Art

FIG. 13 is a schematic diagram illustrating a configuration of a modular power semiconductor device in the background art. FIG. 14 is a sectional view taken along the line A—A of FIG. 13 viewed from the direction of the arrow.

In FIGS. 13 and 14, switching elements T1 to T3 are mounted on an insulating substrate 2 on which a prescribed circuit pattern is formed of conductive foil. On the insulating substrate 2, large conductive foil patterns 21 and 22 and relatively small conductive foil patterns 23, 24 and 25 are formed and the switching elements T1 to T3 are aligned on the conductive foil pattern 21. The insulating substrate 2 is mounted on an upper surface of a heat sink 1 which radiates heat generated during an operation of the switching elements T1 to T3.

A box-shaped resin case 3 is mounted on the upper surface of the heat sink 1 so as to surround the insulating substrate 2. The resin case 3 includes plate-shaped main electrodes M1 and M2 and a signal terminal plate S1 embedded inside its side wall.

Most portions of the main electrodes M1 and M2 and the signal terminal plate S1 are embedded inside the side wall of the resin case 3, except portions protruding through an upper surface of the resin case 3 and portions to be terminal bases N1, N2 and P1 located inside the resin case 3.

The terminal base N1 is an end portion of the main electrode M1, the terminal base N2 is an end portion of the main electrode M2 and the terminal base P1 is an end portion of the signal terminal plate S1. The terminal base N1 is electrically connected to the conductive foil pattern 21, and the terminal base N2 is electrically connected to the switching elements T1 to T3. The control electrodes of the switching elements T1 to T3 (discussed later) are electrically connected to the conductive foil patterns 23 to 25 respectively, and the conductive foil patterns 23 to 25 are electrically connected to the conductive foil pattern 22 through resistors R1 to R3 respectively. Electrical connections between the terminal base and the conductive foil pattern, and between the switching elements and terminal base are established with wire lines WL (bonding wires).

FIG. 15 shows a circuit configuration of the background-art semiconductor device. In FIG. 15, the switching elements T1 to T3 (IGBT: Insulated Gate Bipolar Transistor) are connected in parallel to each other. The respective collector electrodes of the switching elements T1 to T3 are connected to the main electrode M1, the respective emitter electrodes are connected to the main electrode M2, and the gate electrodes are connected to the signal terminal plate S1 through the resistors R1 to R3, respectively.

As can be seen from FIG. 15, the resistors R1 to R3 are gate resistors of the switching elements T1 to T3, respectively, producing an effect of equalizing the respective gate currents of the switching elements T1 to T3 during the on/off control operations of the switching elements T1 to T3.

2

The interconnection paths to the respective gates of the switching elements T1 to T3 can not be always of the same length, for reasons of the layout. When the respective interconnection paths have different lengths, the respective gates of the switching elements T1 to T3 are connected to wire resistances of different values and gate signals for controlling the respective gates have different voltages to produce unequal gate currents of the switching elements T1 to T3. To eliminate the difference of the wire resistances, the resistors R1 to R3 which are sufficiently larger than the wire resistances of the switching elements T1 to T3 are additionally provided, for equal gate currents, and termed "balancing resistors" from their function of equalizing the gate currents of the switching elements T1 to T3.

The configuration of the background-art resistors R1 to R3 will be discussed referring to FIGS. 16A and 16B which shows the part "B" of FIG. 13 in detail.

FIG. 16A is a plan view and FIG. 16B is a sectional view taken along the line B—B of FIG. 16A viewed from the direction of the arrow. As shown in FIGS. 16A and 16B, the background-art resistor R2 (R1 and R3 alike) includes an insulator plate IS, a resistive layer RS of thin film selectively formed on a central portion of an upper main surface of the insulator plate IS, conductive layers CS1 and CS2 of thin film engaged with opposite edge portions of the resistive layer RS, and a protection film PS provided over the resistive layer RS for protecting the resistive layer RS from water infiltration and breakage by external force.

The conductive layers CS1 and CS2 extend in opposite directions from the opposite edge portions of the resistive layer RS along the opposite side surfaces and the opposite edge portions of lower main surfaces of the insulator plate IS, not coming into contact with each other in the lower main surfaces of the insulator plate IS.

When the resistor R2 is joined to the conductive foil patterns 22 and 24 with its side on which no resistive layer RS is provided (i.e., its lower main surface) down so that the conductive layers CS1 and CS2 may be brought into contact with the conductive foil patterns 22 and 24 respectively, a current flows in the resistive layer RS through the conductive layers CS1 and CS2.

A wire line WL connecting to the switching element T2 is bonded to the conductive foil pattern 24 since the wire line WL can not be bonded direct to the conductive layers CS1 and CS2. Thus, the resistor must be disposed across the electrically-independent conductive foil patterns because it does not permit the wire lines to be bonded direct thereon. The conductive foil pattern 24 is needed only for wire bonding.

As discussed above, the background-art power semiconductor device has a configuration where the resistors R1 to R3 are attached to the parallelly-connected switching elements T1 to T3, respectively, in order for uniform operations thereof. The resistors, on which the wire lines can not be bonded direct, has to be disposed across the electrically-independent conductive foil patterns. Therefore, for attachment of the resistors R1 to R3, the conductive foil patterns are needed only for bonding of the wire lines WL connecting to the respective gate electrodes of the switching elements T1 to T3.

In the background-art semiconductor device, the circuit patterns on the insulating substrate are large and complicate because of many limitations in layout design and the necessity for providing the conductive foil patterns used only for wire bonding, and a size-reduction of the whole device can not be achieved.

SUMMARY OF THE INVENTION

The present invention is directed to a semiconductor device. According to a first aspect of the present invention, the semiconductor device comprises: a suspending unit; a resin case being box-shaped and electrically insulative and having a bottom provided with the suspending unit; a circuit board provided on the suspending unit, having a prescribed circuit pattern; at least one switching element provided on the circuit board, having a control electrode; a signal terminal plate for introducing a control signal to be applied to the control electrode of the at least one switching element; and a resistor electrically interposed between the control electrode and the signal terminal plate. The resistor includes an insulator plate; a resistive layer made of thin metal film and selectively provided on one main surface of the insulator plate; a first electrode layer provided on only the one main surface of the insulator plate and connected to the resistive layer, serving as one of current input/output portions of the resistive layer; and a second electrode layer extending from the one main surface to the other main surface of the insulator plate and connected to the resistive layer, serving as the other current input/output portion of the resistive layer. An electrical connection between the control electrode and the resistive layer is made by bonding a wire line direct between the control electrode and the first electrode layer.

According to a second aspect of the present invention, in the semiconductor device of the first aspect, the prescribed circuit pattern of the circuit board includes a first circuit pattern mounted with the at least one switching element; and a second circuit pattern mounted with the resistor, the resistor is mounted on the second circuit pattern with the second electrode layer bonded onto the second circuit pattern, and the signal terminal plate and the second circuit pattern are electrically connected to electrically interpose the resistor between the control electrode and the signal terminal plate.

According to a third aspect of the present invention, the semiconductor device of the first aspect further comprises: a resistor-mounted substrate provided independently of the circuit board, having a circuit pattern for resistor to be mounted with the resistor. In the semiconductor device of the first aspect, the resistor is mounted on the circuit pattern for resistor with the second electrode layer bonded onto the circuit pattern for resistor, and the signal terminal plate and the circuit pattern for resistor are electrically connected to electrically interpose the resistor between the control electrode and the signal terminal plate.

According to a fourth aspect of the present invention, in the semiconductor device of the first aspect, the signal terminal plate has one end protruding out through an upper surface of the resin case and the other end located inside the resin case serving as a terminal base, and the resistor is electrically interposed between the control electrode and the signal terminal plate with the second electrode layer bonded onto the terminal base.

According to a fifth aspect of the present invention, in the semiconductor device of the first aspect, the first electrode layer of the resistor includes a first conductive layer provided so as to come into direct contact with the one main surface of the insulator plate and establish a direct connection with the resistive layer, and a second conductive layer formed on the first conductive layer so as to make wire bonding possible.

In the semiconductor device of the first aspect of present invention, with the resistor which is capable of carrying a current through the first electrode layer, the resistive layer, and the second electrode layer in this order or in the reverse order, the control signal is supplied through the second electrode layer, the resistive layer, and the first electrode layer in this order, in other words, from the lower surface side to the upper surface side by bonding the wire lines direct to the first electrode layer and arranging the resistor with the second electrode layer down so as to be electrically connected to the signal terminal plate. Thus, the semiconductor device of the first aspect achieves higher flexibility in arrangement of the resistor and size-reduction of the whole device, as compared with the background-art semiconductor device in which the resistor does not allow the wire line to be bonded direct thereon and should be arranged across two electrically-independent conductive foil patterns.

The semiconductor device of the second aspect of the present invention achieves a practical configuration to supply the control signal through the second electrode layer, the resistive layer, and the first electrode layer in this order, from the lower surface side to the upper surface side, where the resistor is arranged so that the second electrode layer may be bonded onto the second circuit pattern to establish an electrical connection between the signal terminal plate and the second circuit pattern.

The semiconductor device of the third aspect of the present invention, including the resistor-mounted substrate provided independently of said circuit board, reduces the area of the circuit board as compared with other semiconductor device in which the circuit pattern for resistor is formed on the circuit board. Moreover, the semiconductor device is provided at a lower manufacturing cost when the resistor-mounted substrate is formed of a material cheaper than that of the circuit board.

The semiconductor device of the fourth aspect of the present invention, in which the resistor is electrically interposed between the control electrode and the signal terminal plate with the second electrode layer bonded onto the terminal base which is an end of the signal terminal plate, is reduced in size on the whole as compared with other semiconductor devices in which the circuit pattern for resistor is provided on the circuit board and in which the resistor-mounted substrate is provided independently of the circuit board.

The semiconductor device of the fifth aspect of the present invention achieves a practical configuration to provide a resistor on which wire lines can be bonded direct, for size-reduction of the whole device, where the resistor consists of the first and second conductive layers and the first conductive layer is made of a material which can be closely adhered to the insulator plate and the second conductive layer is made of a material on which the wire lines can be bonded and has an enough area to ensure contact with a bonding tool.

An object of the present invention is to provide a size-reduced semiconductor device which includes resistors on which wire lines can be bonded direct.

These and other objects, features, aspects and advantages of the present invention will become more apparent from the following detailed description of the present invention when taken in conjunction with the accompanying drawings.

DESCRIPTION OF THE PREFERRED EMBODIMENTS

<The First Preferred Embodiment>

Figure 1:
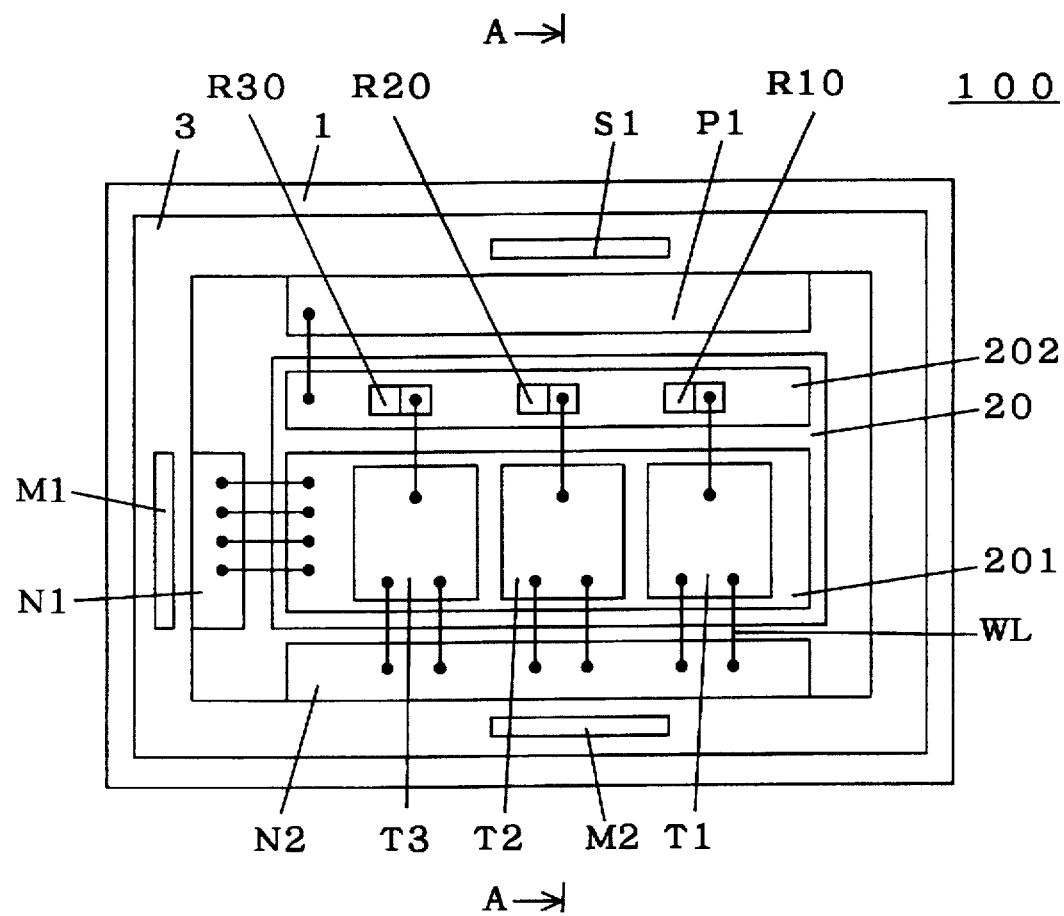
FIG. 1 is a schematic diagram illustrating a configuration of a semiconductor device in accordance with a first preferred embodiment of the present invention.
Figure 2:
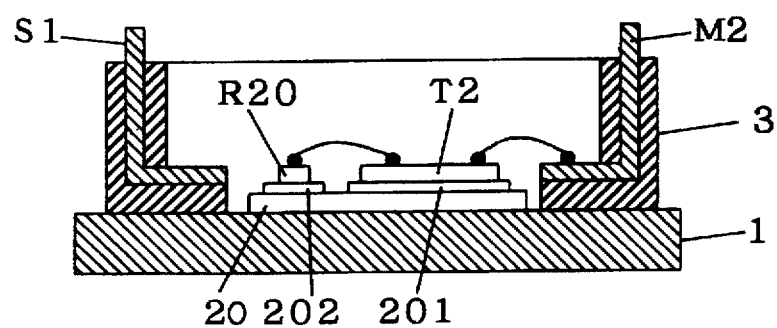
FIG. 2 is a sectional view illustrating the configuration of the semiconductor device accordance with the first preferred embodiment of the present invention.

FIG. 1 is a schematic diagram of a modular power semiconductor device 100 in accordance with the first preferred embodiment of the present invention. FIG. 2 is a sectional view taken along the line A—A of FIG. 1 viewed from the direction of the arrow. Although the shape and arrangement of main electrodes and the arrangement of circuit patterns and switching elements are more complicate in an actual device, a simple configuration is shown herein for simple discussion. Furthermore, a resin filling the inside of the device, a case cover for sealing and the like are omitted.

In FIGS. 1 and 2, the switching elements T1 to T3 and resistors R10 to R30 are mounted on an insulating substrate 20 which is a circuit board provided with a prescribed circuit pattern of conductive foil. Conductive foil patterns 201 and 202 are formed on the insulating substrate 20. The switching elements T1 to T3 are mounted on the conductive foil pattern 201, and the resistors R10 to R30 are mounted on the conductive foil pattern 202. The insulating substrate 20 is mounted on the upper surface of the heat sink 1 which radiates heat generated by the switching elements T1 to T3 during their operations.

The box-shaped resin case 3 is mounted on the upper surface of the heat sink 1 so as to surround the insulating substrate 20. The resin case 3 includes the late-shaped main electrodes M1 and M2 and the signal terminal plate S1 embedded inside its side wall.

Most portions of the main electrodes M1 and M2 and the signal terminal plate S1 are embedded inside the side wall of the resin case 3, except portions protruding through the upper surface of the resin case 3 and portions to he the terminal bases N1, N2 and P1 located inside the resin case 3.

The terminal base N1 is an end portion of the main electrode M1, the terminal base N2 is an end portion of the main electrode M2 and the terminal base P1 is an end portion of the signal terminal plate S1. The terminal base N1 is electrically connected to the conductive foil pattern 201, and the terminal base N2 is connected to the switching elements T1 to T3. The electrical connection between the conductive foil pattern 201 and the switching elements T1 to T3 is not discussed herein because of little concern with the present invention. The control electrodes of the switching elements T1 to T3 (discussed later) are electrically connected to the resistors R10 to R30 respectively with the wire lines WL. Electrical connections between the terminal base and the conductive foil pattern, and between the switching elements and the terminal base are established with wire lines WL.

Figure 15:
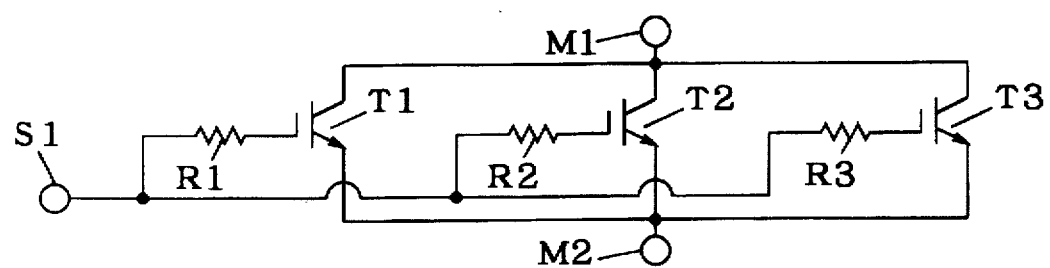
FIG. 15 is a diagram of a circuit configuration of the semiconductor device in the background art.
Figure 16A:
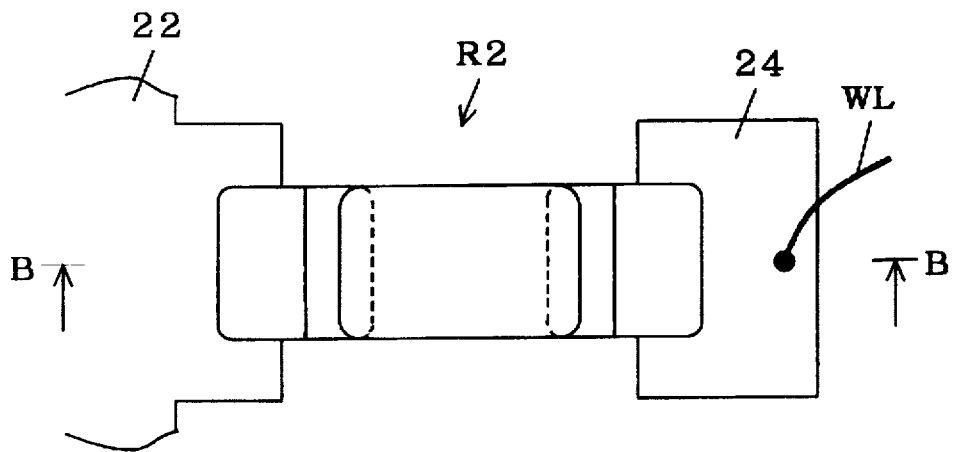
FIGS. 16A and 16B illustrate a configuration of a resistor used in the semiconductor device in the background art.
Figure 16B:
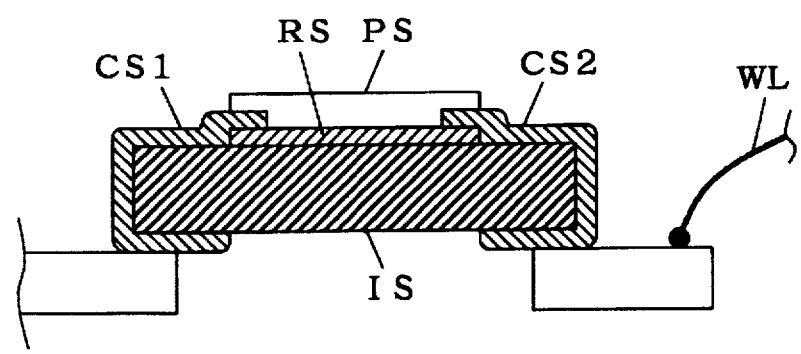

The circuit configuration of the power semiconductor device 100 is almost the same as that of the background-art power semiconductor device of FIG. 15, except that the resistors R10 to R30 are used instead of the resistors R1 to R3 of FIG. 15.

The resistors R10 to R30 are gate resistors of the switching elements T1 to T3, respectively, producing an effect of equalizing the respective gate currents of the switching elements T1 to T3 during the on/off control operations of the switching elements T1 to T3. The interconnection paths to the respective gates of the switching elements T1 to T3 can not be always of the same length, for reasons of the layout. When the interconnection paths have different lengths, the respective gates of the switching elements T1 to T3 are connected to wire resistances of different values and gate signals for controlling the respective gates have different voltages to produce unequal gate currents of the switching elements T1 to T3. To correct the wire resistances, the resistors R10 to R30 are provided, for equal gate currents, and termed "balancing resistors" form their function of equalizing the gate currents of the switching elements T1 to T3.

Figure 3:
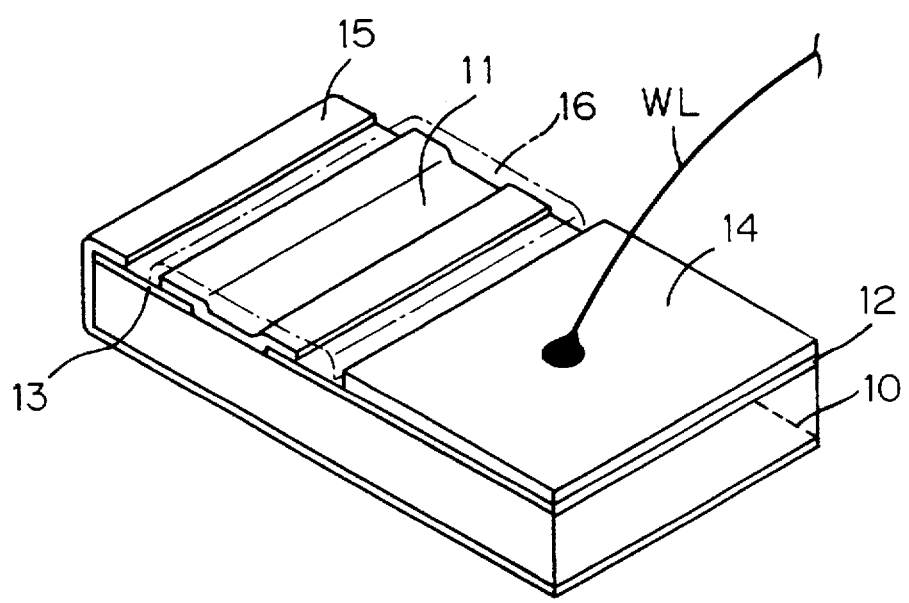
FIG. 3 is a perspective view of a resistor used in the semiconductor device in accordance with the first preferred embodiment of the present invention.

The resistors R10 will be discussed in detail referring to the perspective view of FIG. 3. In FIG. 3, the resistor R10 (R20 and R30 alike) includes an insulator plate 10, a resistive layer 11 of thin metal film selectively formed on an upper main surface of the insulator plate 10, electrode layers 12 and 13 of thin film engaged with opposite edge portions of the resistive layer 11, surface electrode layers 14 and 15 formed over the electrode layers 12 and 13 respectively, and a protection film 16 provided over the resistive layer 10 for protecting the resistive layer 10 from water infiltration and breakage by external force.

The resistive layer 11 is formed of a thin metal film having a thickness in a range of about 10 to 20 μm made of such a material as causes no variation in its resistance value even if the temperature inside the semiconductor device rises (from about room temperature to about 120° to 130° C.) by the heat generated during the operations of the switching elements T1 to T3, such as an alloy film, a metal oxide film and an amorphous metal film.

The electrode layers 12 and 13 extend in opposite directions from below the opposite edge portions of the resistive layer 11 to the opposite edge portions of the insulator plate 10. The surface electrode layer 14 is formed over the electrode layer 12 to the end portions thereof and the surface electrode layer 15 extends from the edge portion of the electrode layer 13 along one of the opposite side surfaces and the entire lower main surface of insulator plate 10. The electrode layers 12 and 13 are thin films each made of a material which has a small resistance value (sufficiently smaller than that of the resistive layer 11) and can be closely adhered to the material of the insulator plate 10, e.g., alumina ceramics (Al₂O₃), such as all alloy of silver and palladium. The surface electrode layer 14 is made of a material that makes wire bonding possible, such as nickel, and has an enough area to ensure contact with a bonding tool. As the surface electrode layer 14 and the electrode layer 12 serve as one of current input or output parts (hereinafter referred to as "one current input/output part"), the two layers may be together termed the first electrode layer. Similarly, as the surface electrode layer 15 and the electrode layer 13 serve as the other current input or output part (hereinafter referred to as "the other current input/output part"), the two layers may be together termed the second electrode layer. Furthermore, the designation as "current input/output part" is made above assuming bidirectional flow of current in the resistor, but the current input/output part may serve as only a current input part or a current output part in a case of one-way flow of current in the resistor.

When the surface electrode layer 15 is joined to the conductive foil pattern 202 (generally by soldering and locally with conductive adhesive), with the side of the resistor R10 on which no resistive layer 11 is provided down, and the wire line WL is bonded to the surface electrode layer 14, a current flows in the resistor R10 through the conductive foil pattern 202, the surface electrode layer 15, the electrode layer 13, the resistive layer 11, the electrode layer 12, the surface electrode layer 14, and the wire line WL in this order (or in the reverse order).

A material of the insulator plate 10 may be alumina nitride ceramics, not limited to alumina ceramics (Al₂O₃).

Thus, in the power semiconductor device 100 of the first preferred embodiment, the resistors R10 to R30 on which the wire line can be bonded and which allows a current flow from the upper surface side to the lower surface side, and vice versa, is joined onto the conductive foil pattern 202, to thereby eliminate the necessity to form an electrically-independent conductive foil pattern only for wire bonding as used in the background art. Accordingly, simple circuit pattern of the insulating substrate 20 and higher flexibility in arrangement of the resistors R10 to R30 can be achieved, and further, size reduction of the whole device can be achieved with reduction in area of the insulating substrate 20.

Figure 13:
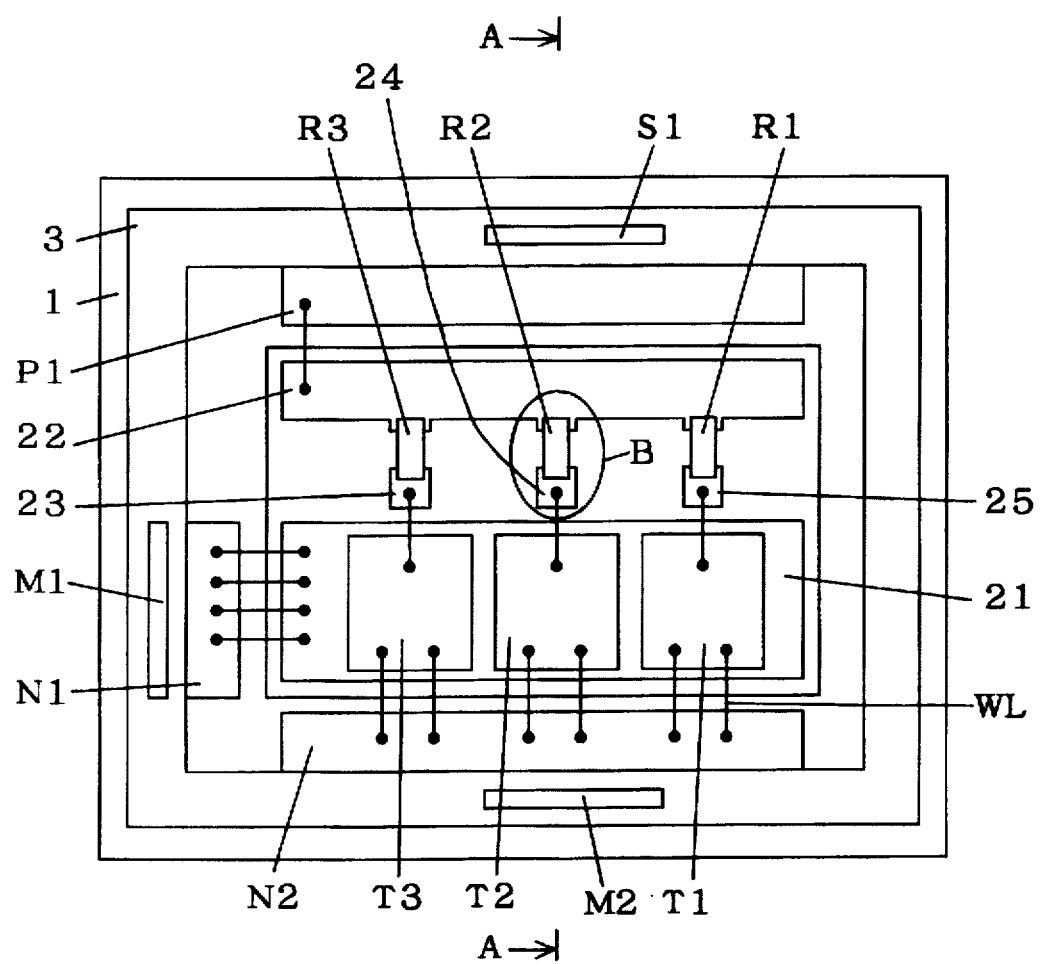
FIG. 13 is a schematic diagram illustrating a configuration of a semiconductor device in the background art.
Figure 14:
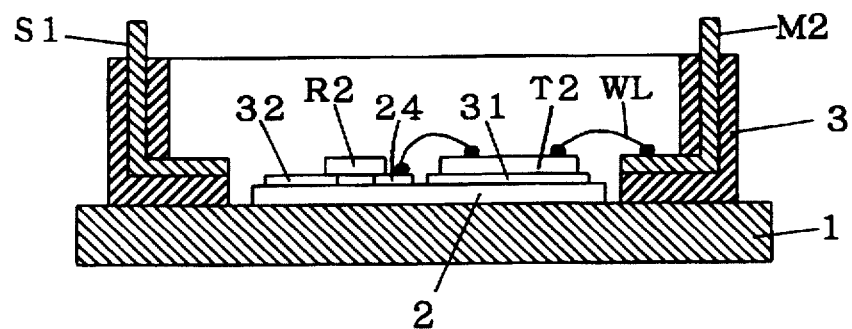
FIG. 14 is a sectional view illustrating the configuration of the semiconductor device in the background art.

For example, in the power semiconductor device 100 of FIG. 1 as compared with FIG. 13, the spacing between the conductive foil patterns 201 and 202 of FIG. 1 is narrower than the spacing between the conductive foil patterns 21 and 22 of FIG. 13 as the conductive foil patterns 23 to 25 are not provided. The area of the insulating substrate 20 is accordingly reduced and the size of the whole device is also reduced.

<The Second preferred Embodiment>

Although it has been discussed above that the resistors R10 to R30 are applied to the switching elements T1 to T3 respectively in the power semiconductor device 100 of the first preferred embodiment, a plurality of resistors may be applied to one switching element.

Figure 4:
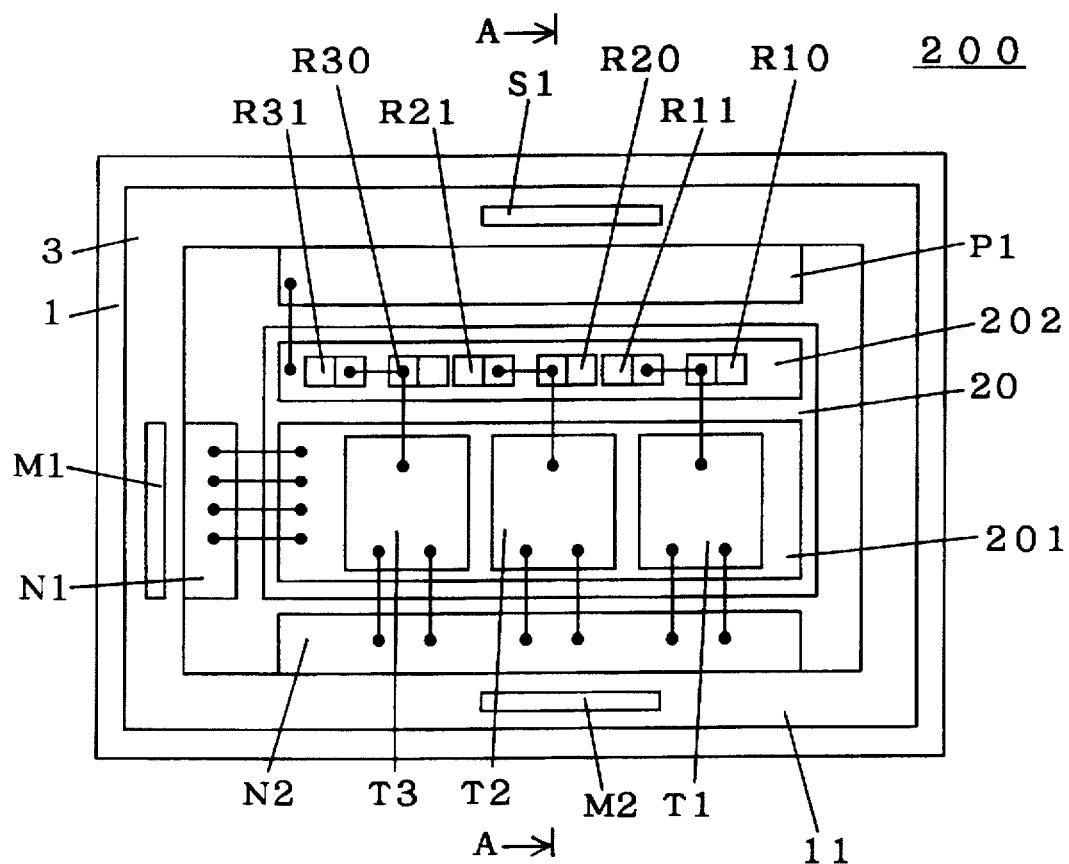
FIG. 4 is a schematic diagram illustrating a configuration of a semiconductor device in accordance with a second preferred embodiment of the present invention.

FIG. 4 is a schematic diagram of a power semiconductor device 200 in accordance with a second preferred embodiment of the present invention. With respect to FIG. 4, like elements are given the same reference characters as those of the power semiconductor device 100 shown in FIG. 1, and duplicate discussion will be omitted.

In FIG. 4, resistors R10, R11, R20, R21, R30 and R31 are mounted on the conductive foil pattern 202. The control electrodes of the switching elements T1, T2 and T3 are electrically connected to the resistors R10, R20 and R30, respectively, with the wire lines WL, and the resistors R10, R20 and R30 are also electrically connected to the resistors R11, R21 and R31, respectively, with the wire lines WL.

Figure 5:
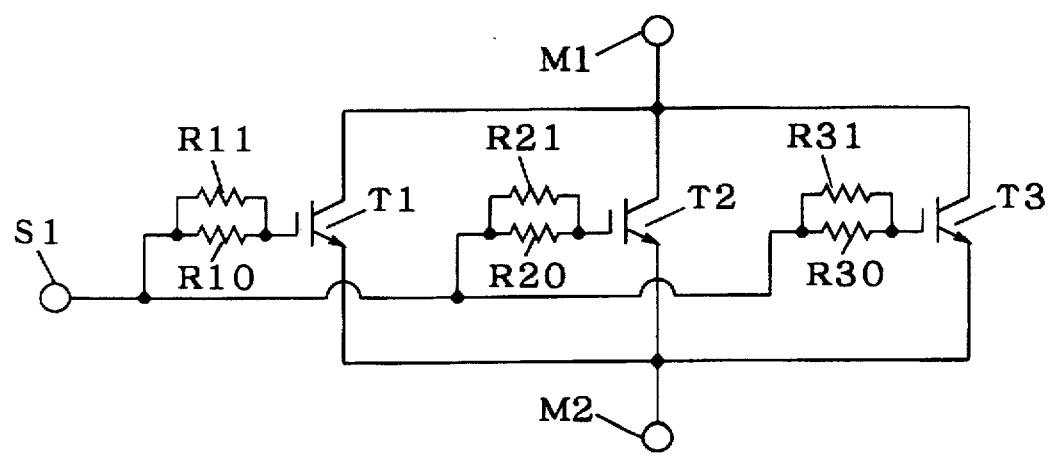
FIG. 5 is a diagram of a circuit configuration of the semiconductor device in accordance with the second preferred embodiment of the present invention.

FIG. 5 is a circuit diagram of the power semiconductor device 200. In FIG. 5, the switching elements T1 to T3 (IGBT: Insulated Gate Bipolar Transistor) are connected in parallel to each other. The collector electrodes of the switching elements T1 to T3 are connected to the main electrode M1 and the emitter electrodes of the switching elements T1 to T3 are connected to the main electrode M2. The gate electrodes of the switching elements T1, T2 and T3 are connected to the signal terminal plate S1 through the parallelly-connected resistors R10 and R11, R20 and R21, and R30 and R31, respectively.

In the power semiconductor device 200 as configured above, the gate resistance value can be changed to any value by mounting a plurality of resistors in advance on the conductive foil pattern 202 and connecting some of them in parallel, as the need arises.

In the background-art semiconductor device which has the necessity for the electrically-independent conductive foil patterns used for wire bonding, an increase in the number of resistors causes an increase in the number and area of the electrically-independent conductive foil patterns. That leads to enlargement of the device and complicated design of layout. With the resistors on which the wire lines can be bonded and which allows a current flow from the upper surface side to the lower surface side and vice versa, the power semiconductor device 200 avoids enlargement of the device and complicated design of layout due to the increase in the number of the resistors.

<The Third Preferred Embodiment>

Figure 6:
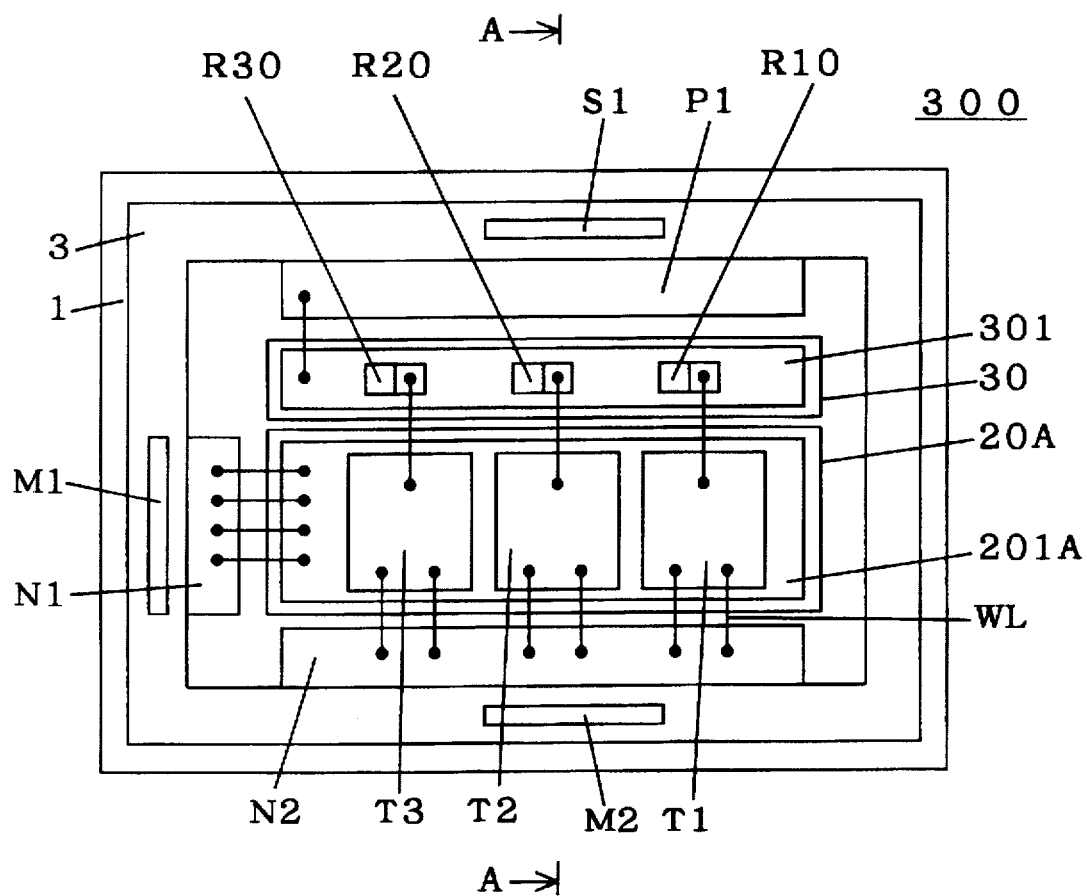
FIG. 6 is a schematic diagram illustrating a configuration of a semiconductor device in accordance with a third preferred embodiment of the present invention.
Figure 7:
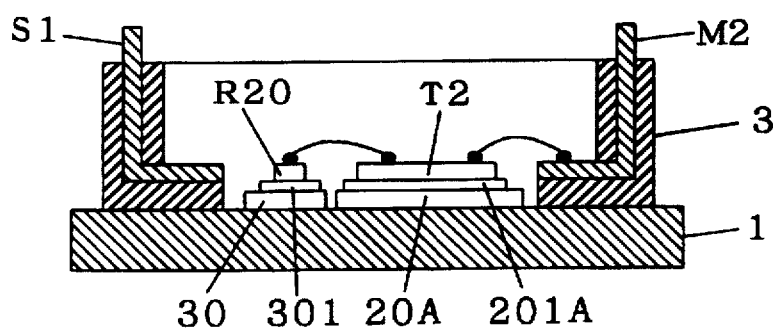
FIG. 7 is a sectional view illustrating the configuration of the semiconductor device in accordance with the third preferred embodiment of the present invention.

FIG. 6 is a schematic diagram of a modular power semiconductor device 300 in accordance with the third preferred embodiment of the present invention. FIG. 7 is a sectional view taken along the line A—A of FIG. 6 viewed from the direction of the arrow. With respect to FIG. 6, like elements are given the same reference characters as those of the power semiconductor device 100 shown in FIG. 1, and duplicate discussion will be omitted.

In FIGS. 6 and 7, an insulating substrate 20A is provided with a conductive foil pattern 201A thereon, and the switching elements T1 to T3 are mounted on the conductive foil pattern 201A. A printed board 30 (e.g., made of glass epoxy resin) which is provided with a prescribed conductive foil pattern 301 thereon is disposed independently of the insulating substrate 20A, and the resistors R10 to R30 are mounted on the conductive foil pattern 301.

In the power semiconductor device 300 as configured above, the area of the insulating substrate 20A is reduced by providing the printed board 30 which is mounted with the resistors R10 to R30 independently of the insulating substrate 20A which is mounted with the switching elements T1 to T3.

An insulating substrate refers to an insulator plate made of alumina nitride ceramics and the like having one main surface provided with a circuit pattern and the other main surface provided with a conductive layer to be joined to a heat sink, and has excellent thermal conductivity but is expensive. For example, the insulating substrate is ten times as expensive as a printed board made of glass epoxy resin of the same area (the printed board is also an insulating substrate in a broad sense, but is worse in thermal radiation than the substrate made of alumina nitride ceramics). The switching element which serves as a heat source has to be mounted on the insulating substrate which is excellent in heat radiation, but other elements do not necessarily have to be mounted on the insulating substrate.

Since the resistors R10 to R30 propagate only gate control signals of the switching elements T1 to T30 and generate little heat, there arises no problem if the resistors R10 to R30 are mounted on the printed board which is made of glass epoxy resin of poor thermal conductivity. There is a likelihood, however, that the heat generated by the switching elements T1 to T3 is transmitted to the printed board 30 and raise the temperature of the printed board 30, so the printed board 30 should be away from the insulating substrate 20A as far as possible, to such an extent as not to enlarge the device. Each of the resistors R10 to R30, using the resistive layer 11 formed of a thin metal film, has little variation in resistance value due to a rise in temperature and is not affected by the rise in temperature of the printed board 30 to some extent.

In the power semiconductor device 300 as configured above, the area of the insulating substrate 20A is reduced by providing the printed board 30 which is mounted with the resistors R10 to R30 independently of the insulating substrate 20A which is mounted with the switching elements T1 to T3. Accordingly, the cost for the insulating substrate is reduced and further the cost for the whole device is also reduced.

<The Fourth Preferred Embodiment>

Figure 8:
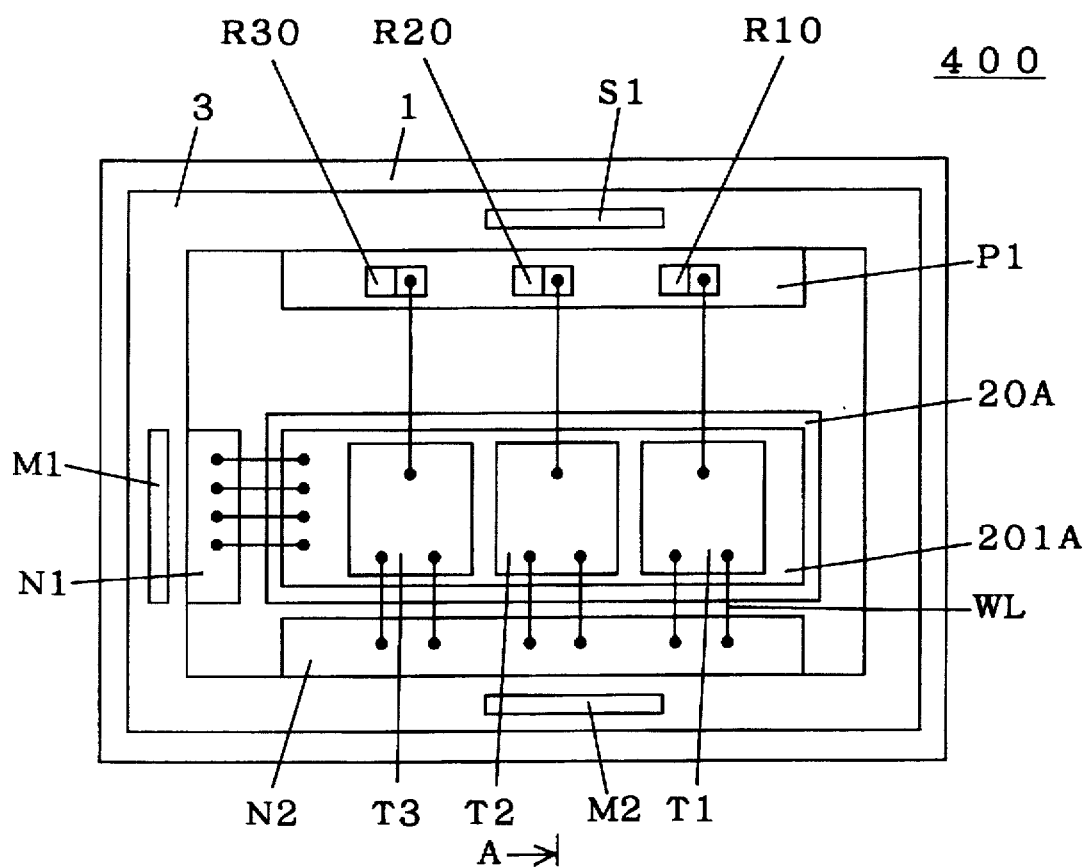
FIG. 8 is a schematic diagram illustrating a configuration of a semiconductor device in accordance with a fourth preferred embodiment of the present invention.
Figure 9:
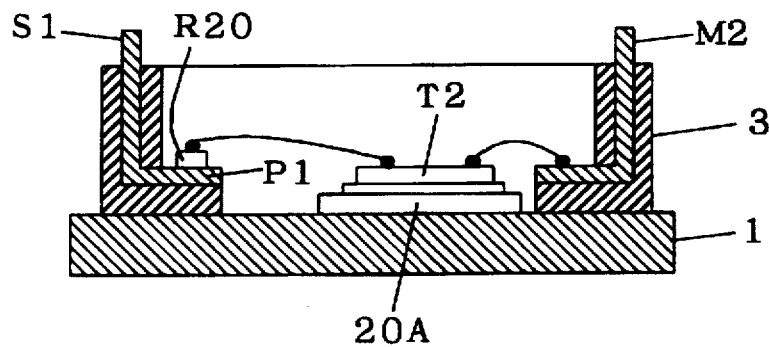
FIG. 9 is a sectional view illustrating the configuration of the semiconductor device in accordance with the fourth preferred embodiment of the present invention.

FIG. 8 is a schematic diagram of a modular power semiconductor device 400 in accordance with the fourth preferred embodiment of the present invention. FIG. 9.is a sectional view taken along the line A—A of FIG. 8 viewed from the direction of the arrow. With respect to FIG. 8, like elements are given the same reference characters as those of the power semiconductor device 100 shown in FIG . 1, and duplicate discussion will be omitted.

In FIGS. 8 and 9, the insulating substrate 20A is provided with the conductive foil pattern 201A thereon, and the switching elements T1 to T3 are mounted on the conductive foil pattern 201A. The resistors R10 to R30 are mounted on the terminal base P1 which is one of the end portions of the signal terminal plate S1.

In the power semiconductor devices 100 to 300 as have been discussed, the resistors R10 to R30 are mounted on the conductive foil patterns formed on the insulating substrate or the printed board. The resistors R10 to R30 may be mounted direct on the terminal base P1 which is one of the end portions of the signal terminal plate S1 if eventually the resistors R10 to R30 are electrically connected to the signal terminal plate S1. This configuration can be achieved by using the resistors R10 to R30 on which the wire lines can be bonded and which allows a current flow from the upper surface side to the lower surface side, and vice versa.

By mounting the resistors R10 to R30 on the terminal base P1, the power semiconductor device 400 of the fourth preferred embodiment eliminates the necessity to provide the conductive foil pattern for mounting the resistors R10 to R30 on the insulating substrate and provide the printed board to be mounted with the resistors R10 to R30 independently of the insulating substrate. Therefore, with the insulating substrate of smaller area and no printed board, the whole device can be reduced in size. In FIG. 8, to clearly show the difference from FIG. 6, the printed board 30 is removed and the space therefor remains blank, but actually, the size of the whole device is reduced by the area represented by blank.

<The Fifth Preferred Embodiment>

Figure 10:
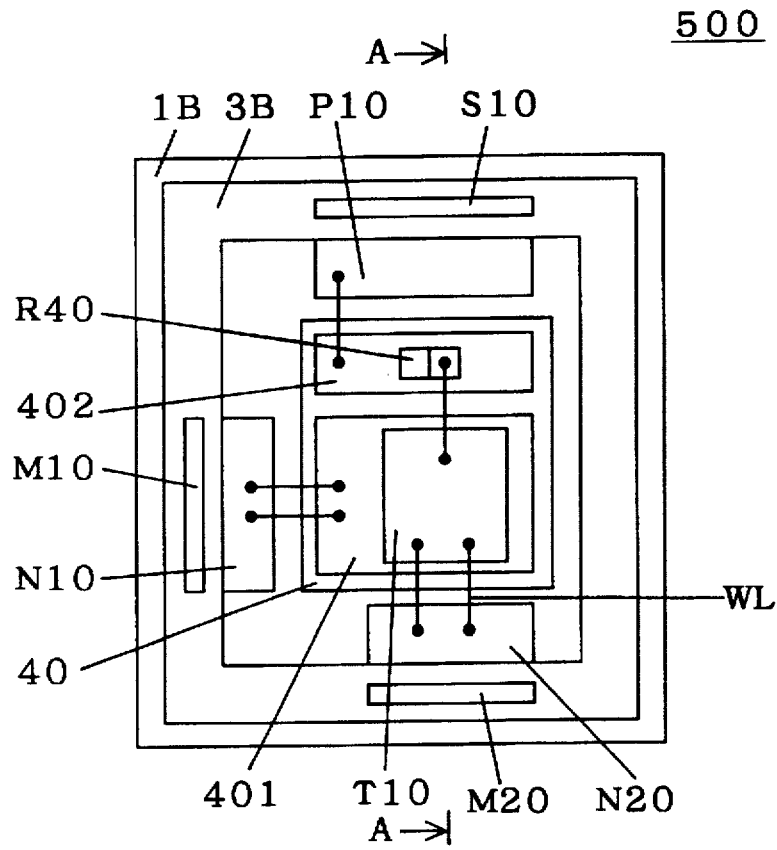
FIG. 10 is a schematic diagram illustrating a configuration of a semiconductor device in accordance with a fifth preferred embodiment of the present invention.
Figure 11:
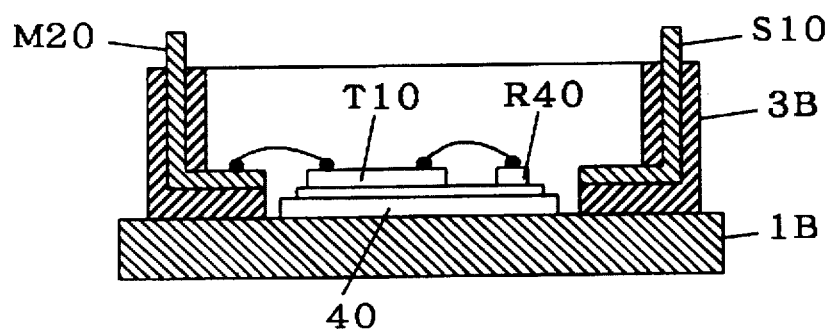
FIG. 11 is a sectional view illustrating the configuration of the semiconductor device in accordance with the fifth preferred embodiment of the present invention.

FIG. 10 is a schematic diagram of a modular power semiconductor device 500 in accordance with the fifth preferred embodiment of the present invention. FIG. 11 is a sectional view taken along the line A—A of FIG. 10 viewed from the direction of the arrow. Although the shape and arrangement of main electrodes and the arrangement of circuit patterns and switching elements are more complicate in an actual device, a simple configuration is shown herein for simple discussion. Furthermore, the resin filling the inside of the device, the case cover for sealing and the like are omitted.

In FIGS. 10 and 11, an insulating substrate 40 which is provided with a prescribed circuit pattern formed of conductive foil is mounted with a switching element T10 and a resistor R40. The insulating substrate 40 is provided with conductive foil patterns 401 and 402, and the switching element T10 and the resistor R40 are mounted on the conductive foil patterns 401 and 402, respectively. Furthermore, the insulating substrate 40 is mounted on an upper surface of a heat sink 1B which radiates heat generated by the switching element T10 during its operation.

A box-shaped resin case 3B is mounted on the upper surface of the heat sink 1B so as to surround the insulating substrate 40. The resin case 3B includes plate-shaped main electrodes M10 and M20 and a signal terminal plate S10 embedded inside its side wall.

Most portions of the main electrodes M10 and M20 and the signal terminal plate S10 are embedded inside the side wall of the resin case 3B, except portions protruding through an upper surface of the resin case 3B and portions to be terminal bases N10, N20 and P10 inside the resin case 3B.

The terminal base N10 is an end portion of the main electrode M10, the terminal base N20 is an end portion of the main electrode M20 and the terminal base P10 is an end portion of the signal terminal plate S10. The terminal base N10 is electrically connected to the conductive foil pattern 401, and the terminal base N20 is electrically connected to the switching element T10. The electrical connection between the conductive foil pattern 401 and the switching element T10 is not discussed herein because of little concern with the present invention. The control electrode of the switching element T10 (discussed later) is electrically connected to the resistor R40 with the wire line WL. Electrical connections between the terminal base and the conductive foil pattern, and between the switching element and terminal base are established with wire lines WL.

Figure 12:
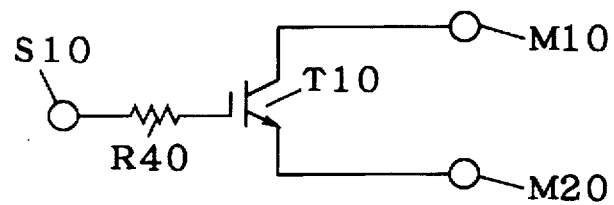
FIG. 12 is a diagram of a circuit configuration of the semiconductor device in accordance with the fifth preferred embodiment of the present invention.

A circuit configuration of the power semiconductor device 500 will be discussed referring to FIG. 12. In FIG. 12, the collector electrode of the switching element T10 is connected to the main electrode M10) and the emitter electrode of the switching element T10 is connected to the main electrode M20. The gate electrode of the switching element T10 is connected to the signal terminal plate S10 through the resistor R40.

As can be seen from FIG. 12, the resistor R40 is a gate resistor of the switching element T10, and in this case, has a function of controlling the charging/discharging speed of a parasitic capacitor in the switching element 10 since the switching element T0 is used alone.

In general, the operating speed (switching speed) of the switching element is determined by the charging/discharging speed of the parasitic capacitor in the switching element. Accordingly, the resistor R40 is used for controlling the operating speed of the switching element T10.

As the resistance value of the resistor R40 increases, the operating speed of the switching element T10 becomes lower. In other words, the resistor R40 controls the operation of the switching element T10 to be slower. With resistor R40, the switching element T10 operates at the highest speed. High-speed operation of the switching element T10 brings a fast change of the current and voltage in the switching element T10, and is likely to cause a noise and the like. The resistor R40 is provided so as to control the operation of the switching element T10 to be appropriately slower, thereby suppressing generation of the noise and the like and ensuring ease of use.

Although the resistors R10 to R30 in the power semiconductor devices 100 to 400 have been discussed with emphasis on the function as the balancing resistors, these resistors naturally have a function of controlling the operating speed of the switching elements.

Since the resistor R40 on which the wire lines can be bonded and which allows a current flow from the upper surface side to the lower surface side and vice versa is bonded onto the conductive foil pattern 402, the power semiconductor device 500 of the fifth preferred embodiment has no necessity to provide the electrically-independent conductive foil pattern only for wire bonding, and accordingly achieves simple circuit pattern on the insulating substrate 40 and area-reduced insulating substrate 40. Thus, size-reduction of the whole device can be achieved.

Furthermore, the configurations of the power semiconductor devices 200 to 400 as discussed earlier may be naturally applied to the power semiconductor device 500.

While the invention has been shown and described in detail, the foregoing description is in all aspects illustrative and not restrictive. It is therefore understood that numerous modifications and variations can be devised without departing from the scope of the invention.

We claim:

1. A semiconductor device, comprising:

a suspending unit;

a resin case being box-shaped and electrically insulative and having a bottom provided with said suspending unit;

a circuit board provided on said suspending unit, having a prescribed circuit pattern;

at least one switching element provided on said circuit board, having a control electrode;

a signal terminal plate for introducing a control signal to be applied to said control electrode of said at least one switching element; and a resistor electrically interposed between said control electrode and said signal terminal plate, wherein said resistor includes, an insulator plate;

a resistive layer made of thin metal film and selectively provided on one main surface of said insulator plate;

a first electrode layer provided on only said one main surface of said insulator plate and connected to said resistive layer, serving as one of current input/output portions of said resistive layer; and a second electrode layer extending from said one main surface to the other main surface of said insulator plate and connected to said resistive layer, serving as the other current input/output portion of said resistive layer, and wherein an electrical connection between said control electrode and said resistive layer is made by bonding a wire line direct between said control electrode and said first electrode layer.

2. The semiconductor device of claim 1, wherein said prescribed circuit pattern of said circuit board includes:

a first circuit pattern mounted with said at least one switching element; and a second circuit pattern mounted with said resistor, said resistor is mounted on said second circuit pattern with said second electrode layer bonded onto said second circuit pattern, and said signal terminal plate and said second circuit pattern are electrically connected so as to electrically interpose said resistor between said control electrode and said signal terminal plate.

3. The semiconductor device of claim 1, further comprising:

a resistor-mounted substrate provided independently of said circuit board, having a circuit pattern for resistor to be mounted with said resistor, wherein said resistor is mounted on said circuit pattern for resistor with said second electrode layer bonded onto said circuit pattern for resistor, and said signal terminal plate and said circuit pattern for resistor are electrically connected so as to electrically interpose said resistor between said control electrode and said signal terminal plate.

4. The semiconductor device of claim 3, wherein:

said circuit board includes a nitride aluminum plate serving as an insulating member, said nitride aluminum plate has one main surface provided with said prescribed circuit pattern and the other main surface provided with a conductive layer to be bonded to said suspending unit, said resistor-mounted substrate includes a glass epoxy resin plate serving as an insulating member, and said glass epoxy resin plate has one main surface provided with said circuit pattern for resistor and the other main surface provided with a conductive layer to be bonded to said suspending unit.

5. The semiconductor device of claim 1, wherein:

said signal terminal plate has one end protruding out through an upper surface of said resin case and the other end located inside said resin case serving as a terminal base, and said resistor is electrically interposed between said control electrode and said signal terminal plate with said second electrode layer bonded onto said terminal base.

6. The semiconductor device of claim 1, wherein said first electrode layer of said resistor includes, a first conductive layer provided so as to come into direct contact with said one main surface of said insulator plate and establish a direct connection with said resistive layer, and a second conductive layer formed on said first conductive layer so as to make wire bonding possible.

7. The semiconductor device of claim 6, wherein:

said first conductive layer is a thin film layer made of an alloy of silver and palladium, and said second conductive layer is a thin film layer made of nickel.

* * * * *